(12) United States Patent
Moore et al.

(10) Patent No.: US 10,290,531 B2
(45) Date of Patent: May 14, 2019

(54) RELEASE LAYER FOR SUBSEQUENT MANUFACTURE OF FLEXIBLE SUBSTRATES IN MICROELECTRONIC APPLICATIONS

(71) Applicant: John Cleaon Moore, Camirillo, CA (US)

(72) Inventors: John Cleaon Moore, Camirillo, CA (US); Jared Pettit, Camarillo, CA (US); Alman Law, Camarilo, CA (US)

( * ) Notice: Subject to any disclaimer, the term of this patent is extended or adjusted under 35 U.S.C. 154(b) by 371 days.

(21) Appl. No.: 14/787,789

(22) PCT Filed: Apr. 29, 2014

(86) PCT No.: PCT/US2014/035889
§ 371 (c)(1),
(2) Date: Oct. 29, 2015

(87) PCT Pub. No.: WO2014/179324
PCT Pub. Date: Nov. 6, 2014

(65) Prior Publication Data
US 2016/0071756 A1 Mar. 10, 2016

Related U.S. Application Data

(60) Provisional application No. 61/817,853, filed on Apr. 30, 2013.

(51) Int. Cl.
| | |
|---|---|
| *H01L 21/683* | (2006.01) |
| *H01L 21/02* | (2006.01) |
| *B32B 7/06* | (2019.01) |
| *B32B 17/10* | (2006.01) |
| *B32B 18/00* | (2006.01) |
| *B32B 25/00* | (2006.01) |
| *B32B 17/06* | (2006.01) |
| *B32B 27/06* | (2006.01) |

(52) U.S. Cl.
CPC ............ *H01L 21/6836* (2013.01); *B32B 7/06* (2013.01); *B32B 17/06* (2013.01); *B32B 17/1077* (2013.01); *B32B 17/10724* (2013.01); *B32B 17/10733* (2013.01); *B32B 17/10743* (2013.01); *B32B 17/10798* (2013.01); *B32B 18/00* (2013.01); *B32B 25/00* (2013.01); *B32B 27/06* (2013.01); *H01L 21/6835* (2013.01); *H01L 2221/6835* (2013.01); *H01L 2221/68318* (2013.01); *H01L 2221/68377* (2013.01); *H01L 2221/68381* (2013.01); *H01L 2221/68386* (2013.01)

(58) Field of Classification Search
None
See application file for complete search history.

(56) References Cited

U.S. PATENT DOCUMENTS

| | | | | |
|---|---|---|---|---|
| 2009/0205695 | A1* | 8/2009 | Makansi | H01J 45/00 136/201 |
| 2009/0317635 | A1* | 12/2009 | Amano | C09J 7/0217 428/355 AC |
| 2013/0034935 | A1* | 2/2013 | Matsumura | H01L 24/27 438/118 |

\* cited by examiner

*Primary Examiner* — Frank D Ducheneaux
(74) *Attorney, Agent, or Firm* — Andrew Auerbach

(57) ABSTRACT

Compositions and methods are described for a release layer that is affixed directly onto a carrier or with the use of an interfacial adhesive layer to fabricate a flexible work product, and upon completion, the release layer is removed by an external applied force of a given value that overcomes the adhesive force without harm to the work product. The release layer serves as a permanent support for the manufacture of flexible electronic devices and upon completion offers a simple means to achieve a wide range of thin and ergonomically pleasing options for the consumer. The invention provides benefits of flexibility in choosing a host of materials to meet the needs of a specific manufacturing objective and rapidly moving towards the next step in the manufacture of semiconductors and flat panel displays.

21 Claims, No Drawings

RELEASE LAYER FOR SUBSEQUENT MANUFACTURE OF FLEXIBLE SUBSTRATES IN MICROELECTRONIC APPLICATIONS

CROSS-REFERENCE TO RELATED APPLICATION

This application claims the benefit of U.S. Provisional Application No. 61/817,853, filed Apr. 30, 2013.

Release layers that are used as permanent flexible substrates are disclosed. A flexible substrate refers to, for example, organic and inorganic compositions that exist as release layers to a temporary rigid carrier (e.g. glass, silicon, etc.) and offering a host of benefits, including thermal resistance, transparency, and easy removal. Such release layers allow the deposition of thin solids as metals, dielectrics, and in detailed configurations to allow the manufacture of integrated circuits (ICs), microelectro-mechanical systems (MEMS), flat panel displays (FPD), solar substrates, and the like, whereby upon completion of work, the release layer is removed from the rigid carrier and proceeds with packaging The release layer may be applied as a coating to a temporary rigid carrier from a variety of processes to include liquid casting, electroplating, plasma deposition, and forming operations from rolled thin solids. The ease of removal of the release layer from the carrier is mainly dependent upon the adhesion level to the underlying substrate. Adhesion of the release layer to the carrier is controlled by the chemistry of the release layer or of a separate interfacial layer that exists between the release layer and the carrier substrate. In the case of an adhesive interfacial layer, its form and composition are described in the invention application, Temporary Adhesive with Tunable Adhesion Force Sufficient for Processing Thin Solid Materials, PCT/US14/19376, dated Feb. 28, 2014.

The release layer has several advantages when used in the manufacture of flexible substrates for electronics manufacturing: thermal resistance (layer is resistant to temperature excursions exceeding 500° C.); low or insignificant contribution of carrier stress from coefficient of thermal expansion (CTE) (release layer may be very thin); chemical resistance (release layer is thin whereby chemicals cannot easily penetrate the matrix); tunable adhesive properties (release layer readily adheres directly to the carrier or to an adhesive layer that has been tuned for easy removal); transparency of substrate (compositions exist which exhibit high % transmittance @>380 nm); simple removal of release layer by peeling or other simple mechanisms (external required force is limited, well within tensile force of the coating/film).

The release layer generally comprises a mixture of as binder materials from one or more organic polymer families, including but not limited to, epoxies, acrylates, silicones, urethanes, and rubbers, and engineering polymers, as well as inorganic solutes, including but not limited to, silicates, borates, phosphates, sulfates, and halogenates. These materials may exhibit thermoplastic or thermoset properties. Those who are familiar with the art recognize these materials exhibit different functionality and as such, are known to interact accordingly by their chemistry with that of certain substrates.

The release layer may become a permanent substrate onto which solid materials are deposited that either directly or indirectly constitutes the microelectronic device. The solid materials used with this invention include inorganic and organic films. Inorganic thin solid materials include films and foils of metals and ceramics. Metal films and foils may be used to include copper (Cu), nickel (Ni), iron (Fe), cobalt (Co), titanium (Ti), tantalum (Ta), tungsten (W), molybdenum (Mo), chromium (Cr), aluminum (Al), gold (Au), silver (Ag), neodymium (Ne), palladium (Pd), platinum (Pt), osmium (Os), iridinium (Ir), rhodium (Rh), ruthenium (Ru), alloys thereof, such as nickel iron (NiFe), and nitrides thereof, such as titanium nitride (TiN, or $TiN_x$), where x represents the stoichiometry of the thermodynamically stable material, and silicon nitride ($Si_3N_4$). Thin solid metals may exist initially as foils or may be vacuum deposited onto the release layer such that a thin solid form of the metal is completed to a level that its integrity is of a minimum requirement sufficient to proceed with manufacturing and may be removed later with the release layer by an external applied force. The minimum integrity of the thin solid metal material may be defined by several properties, to include a tensile strength that exceeds the adhesion force of the temporary adhesive.

Deposited thin solid materials onto the release layer may exist as non-film or non-foil metals which may be deposited by electrochemical or plasma processing. These metals include copper (Cu), nickel (Ni), iron (Fe), indium (In), cobalt (Co), titanium (Ti), tantalum (Ta), tungsten (W), molybdenum (Mo), chromium (Cr), aluminum (Al), gold (Au), silver (Ag), neodymium (Ne), palladium (Pd), platinum (Pt), osmium (Os), iridinium (Ir), rhodium (Rh), ruthenium (Ru), alloys thereof, such as nickel iron (NiFe), and nitrides thereof, such as titanium nitride (TiN, or $TiN_x$), where x represents the stoichiometry of the thermodynamically stable material, and silicon nitride ($Si_3N_4$). Crystalline and amorphous ceramic materials may also be deposited onto the release layer, including silicon, gallium arsenide, quartz, glass, alloying mixtures thereof, and oxides thereof, including indium tin oxide (ITO), indium gallium zinc oxide (IGZO), silicon dioxide ($SiO_2$, or $SiO_x$), where x represents the stoichiometry of the thermodynamically stable material. These ceramic and glass materials may exist initially as foils or films. Thin solid ceramic and glass materials may be produced by vacuum deposition onto a release layer such that a thin solid form of the ceramic or glass is completed to a level such that its integrity meets a minimum requirement sufficient to proceed with manufacturing and may be removed on the release layer by an external applied force. The minimum integrity of the thin solid ceramic or glass material onto the release layer may be defined by several properties, to include a tensile strength that exceeds the adhesion force existing onto the carrier substrate.

Organic polymers applied to the release layer as films, cast from liquids, or vacuum deposited include polyimides such as Kapton® (registered trade mark of E.I. du Pont de Nemours and Company), polyarylether such as Arylite® (registered trade mark of Ferrania), polyesters such as Mylar® (registered trade mark of DuPont Teijin Films), polypropylene, polyethylene, polysulfone (polysulfone, polyethersulfone, polyphenylsulfone) such as Radel® (registered trade mark of Solvay Solexis), polybenzimidazole, polyphenylene sulfide such as Torelina® (registered trade mark of Toray Film Products, Co., Ltd.), polycarbonate, polystyrene, polyacrylic, fluoropolymers as fluoroethylene propylene (FEP), perfluoroalkoxy polymer (PFA), ethyltetrafluoroethylene (ETFE), and ethylene-chlorotrifluoroethylene (ECTE) such as Halar® (registered trade mark of Solvay Solexis), polyvinylidene fluoride (PVDF) such as Kynar® (registered trade mark of Solvay Solexis), polyether ether ketone (PEEK), polyether imide (PEI), polybutylene terephthalate (PBT), polyethylene naphthalate (PEN), and various polyamides classified as nylon. The stack of the thin solid form on the release layer is completed to a level such that its integrity reaches a minimum requirement sufficient to complete manufacturing and be removed later by an external applied force. The minimum integrity of the thin solid material on release layer may be defined by several properties, including a tensile strength that exceeds the adhesion force between the release layer and the carrier substrate.

The chemistry of the release layer may comprise polymeric resins from at least one specific chemical family and may also be combined with other separate chemical families. The integrity of the release layer may be defined by its tensile force that is controlled by the content adjustment of mixing resins of different molecular weights or functionality within a chemical family or by mixing between different chemical families. For example, the release layer may comprise one or more resins from the family of epoxy resins (i.e. alkyl epoxy, novolac epoxy, etc.) whereas, another release layer may comprise one or more resins from different chemical families (i.e. epoxy and acrylic, etc.). The variation of these resin choices will produce a direct effect on the adhesive force of the system in affixing the thin solid material onto the carrier substrate. Those familiar with the art recognize that in order to effect the reaction of such chemistries, there must also include the necessary initiators. These initiators are considered as cross-linkers, activators, catalysts, or reactors, and represent a small portion of the overall composition. Therefore, it shall be understood that whenever mention is made about the use of a specific chemistry or resin, that chemistry must include the respective initiator, and the choice of the initiator may produce certain subtle differences, the primary emphasis is that an initiator that is matched with the chemistry of choice and included in the system.

The release layer may comprise a variety of base organic resins. The reactive resins include, but are not limited to, those undergoing cross-linking polymerization mechanisms, including epoxies, acrylates and silicones. These systems undergo thermal, chemical, and photo-initiated polymerization by condensation and addition mechanisms as described in the literature, and described as thermosets. Thermoset chemistries offer rigidity and resistance to the process conditions. Non cross-linking resins include those described as amorphous or thermoplastics. The thermoplastic resins may add strength and durability to the adhesive. Additional properties by amorphous polymers include barrier (gas non-diffusion), temperature resistance, transparency, detergency, and water solubility. The following passages offer more detail on the resins used in the coating chemistry. The production of a release layer in this invention is not limited to the resins identified here.

Epoxy resins used for the release layer may comprise a single or multiple epoxide functional group, also called oxirane, or ethoxyline, normally identified as a three-membered oxide ring described by the following structures classified as (1) glycidyl ethers, (2) glycidyl esters, (3) gylcidyl amines, (4) linear aliphatics, and (5) cycloaliphatics:

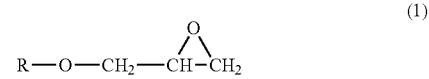

(1)

(2)

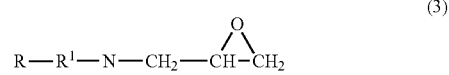

(3)

(4)

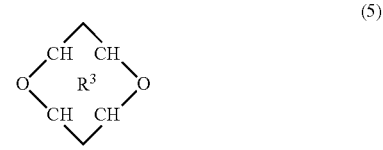

(5)

where both R, $R^1$, and $R^2$ may represent the following: hydrogen (—H), amide (—$NH_2$), methyl (—$CH_3$), hydroxyl (—OH), alcohol (—$CH_2OH$), or any one of the groups represented by the formula —$C_nH_{(2n)}$, —$C_nH_{(2n+1)}$, or —$C_nH_{(2n)}OH$ where n varies from 2-20; cyclic and aromatic hydrocarbon functional groups of the formula —$C_6X_5$, where X may be substituent groups such as hydrogen (—H), the halogens (—F, —Br, —Cl, —I), hydroxyl (—OH), and —COOH groups, $R^3$ represents a cyclic or aromatic structure of the formula —$C_6X_5$, where X may be substituent groups such as hydrogen (—H), the halogens (—F, —Br, —Cl, —I), hydroxyl (—OH), and —COOH groups, all of these variations may exist in multiple substituent formats, or monomers, as given in the example structure (6):

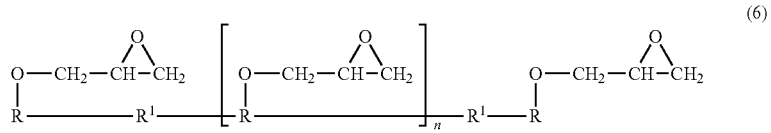

(6)

wherein structure (6) describes a polymer comprising monomers of glycidyl ether with substituent R and linked by R'. Such resins may include: CARDOLITE 514 (difunctional glycidyl ether epoxy resin) produced by Cardolite Corporation, ADEKA EP 4088S (epoxy resin and urethane resin curing agent) produced by Adeka Corporation, EBECRYL3605 (partially acrylated bisphenol-A epoxy) produced by Cytec Industries, Inc.

In one embodiment, the epoxy resin includes that of structure (6), wherein the monomeric epoxide substituent is of the novolac variety, also referred to as epoxidized novolac resin, where R represents an aromatic ring of the form $C_6X_5$, where X may be substituent groups such as hydrogen (—H), the halogens (—F, —Br, —Cl, —I), hydroxyl (—OH), and —COOH groups, and the linkage $R^1$ is best represented by substituents of the formula —$C_nH_{(2n)}$. Such epoxy novolac resins include 3-6 epoxide groups per molecule (n=1.6) of the general formula exhibited by the structure (6). General commercialized products which meet this criteria include: DEN 431 and DEN 439 produced by The DOW Chemical Company; EPON 154, EPON 160 and EPON 161 produced by Resolution Performance Products (Hexion), REZICURE 3056 produced by SI Group.

Acrylic monomers and polymers used as a release layer include acrylate esters by the general formula described in item (7), where both $R_1$ and $R_2$ may represent the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20; aromatic hydrocarbon functional groups of the formula —$C_6X_5$, where X may be substituent groups such as hydrogen (—H), the halogens (—F, —Br, —Cl, —I), hydroxyl (—OH), —COOH; and —$COOR_3$ groups, wherein $R_3$ represents the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20.

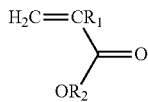

(7)

It is to be understood that where substituent groups are present, they should be present in a manner such that they do not unduly hinder or interfere with the thermal or photo initiated cure of the acrylic monomer. The preferred acrylic monomers are those represented by item (7), wherein $R_1$ is a hydrogen (—H), or methyl (—$CH_3$), defining the molecule as an acrylate or methacrylate, respectively, and $R_2$ to represent a substituent of the form or —$C_nH_{(2n)}OH$ where n varies from 2-20. Such preferred acrylics include hydroxyethyl acrylate (CAS #818-61-1), hydroxypropyl acrylate (CAS #25584-83-2), hydroxyethyl methacrylate (CAS #868-77-9), and hydroxy propyl methacrylate (CAS #27813-02-1). The more preferred acrylic monomers are those represented by item (7), wherein $R_1$ is a hydrogen (—H), or methyl (—$CH_3$), and $R_2$ to represent a substituent of the form amide (—$NH_2$), defining the molecule as an acrylamide. Such preferred acrylics include n,n-dimethyl-acrylamide (DMAA, CAS #2680-03-7). DMAA has been shown to exhibit high compatibility and solubility for other resins and a significantly faster curing time over the conventional acrylates or methacrylates.

Polysiloxane resins suitable for use as a release layer exist in commerce by multiple suppliers, exhibiting broad classification differences in silicone subcategories, types, and polarities, and reacting through different mechanisms, including addition and condensation polymerization. The use of such materials in the preparation of release layers shall consider compatibility and reactivity between the polysiloxanes as a key factor in determining their final behavior. For example, species of similar polarity may be compatible yet be inconsistent in their preferred reaction mechanisms. These include organofunctional polysiloxanes and silicone resin intermediates, both are expected to undergo thermal initiated condensation reactions following hydrolysis. However, vinyl silicones (rubbers) are largely a phobic chemistry and undergo addition reactions with metal catalysts. Therefore, we will differentiate these chemistries accordingly, as a release layer following the same considerations of compatibility and reactivity.

The preferred polysiloxanes include oxysilanes of the formulas represented as $(R_1)$—$[(R_2)(R_3)SiO]_n$—$R_4$ or $(R_5)$ O—$[(R_3)_2SiO]_m$—$R_5$, where $R_1$, $R_2$, and $R_3$, may exist as a hydrogen or carbon containing functional group of the variety as alkyl, phenyl, cycloalkyl, alkoxy, hydroxyalkyl, alkoxyalkyl, and hydroxyalkyalkoxy, where these groups may contain up to 6 carbons, and $R_4$ comprises hydrogen, alkyl, or phenyl, where a minimum of 2 of the groups are oxy substituents used for polymerization, and $R_5$ is similar to $R_4$, however, there may exist up to 12 carbons, and n and m varies from 1-5 or to a sufficient number to reach a molecular weight of 500,000.

The siloxane resins suitable as release coatings include a broad range of alkyl, aryl, oxygenated, and cyclic substitutions. In the case where thermal resistance is critical, the substitution will be methyl and phenyl. The moieties on the siloxane can also exhibit specific organic functional groups which are well known to interact with the chemistry of the substrate interface. For example, in the case of a mercaptan siloxane moiety, the sulfur group interacts with certain inorganic solid surfaces, such as metals, to increase the interfacial force to the carrier substrate or adhesive. Most importantly, moieties which exhibit epoxy, acrylic, or amine character, are known to interact with a corresponding chemistry within an organic matrix and at the interface of polymeric solid surfaces, resulting in molecular entanglement and van der Waals interactions as hydrogen and covalent bonding, and ultimately, an increase of interfacial adhesion.

For release coatings, silicone resins based on cyclic siloxane molecules are preferred. Useful cyclic silicones are hydroxy functional cyclic silicones classified as liquid resins, flake resins, and silicone intermediates as provided by suppliers Dow Corning (www.dowcorning.com) and Wacker Silicones (Wacker-Chemie GmbH) (www.wacker.com). Preferred cyclic siloxane choices for adhesive development, include those with high compatibility with other polymers, dissolution in a wide range of solvents, and those classified as silanols. These silanol compounds exhibit relatively high capacity for condensation reactivity and include those with two or more hydroxyl groups per cyclic silicone molecular unit and a phenyl/methyl ratio ranging from 50-120% and a molecular weight ranging from 4,000 to 300,000. In all cases, the relative content of silicon dioxide is high, usually greater than 50%.

When using thermosetting resins, the chosen initiator is dependent upon the polymer and the application. Epoxy based systems use organic amine and acid materials to open the oxirane ring and initiate cross-linking. These may be promoted by thermal or photo means. Free-radical initiators are used with acrylics, also promoted by applications that apply heat or ultraviolet exposure. Silicone vinyl compounds require metal catalysts to initiate free-radical generation. These classes of initiators and the required media to support polymerization and enable applications of the adhesive to facilitate fixation of the two surfaces. In one embodiment, an epoxy resin system is used with an initiator of the polyamine form and of higher molecular weight. Higher molecular weight amine chemistries will remain in the system for longer durations and provide an environment, which efficiently cross-links the epoxy resin. Amines may include triethylenetetramine (TETA), N-methylethanolamine (NMEA), and N-methyldiethanolamine (DMEA) produced by The DOW Chemical Company, and meta-xylenediamine (MXDA) as produced by Mitsubishi Chemical Company. Desirable amine amounts are typically present at levels from about 1% to about 5%, by weight as compared that of the epoxy. A similar approach for epoxies may also be used with acidic materials. The acids tend to have higher reaction rates with epoxies over that of amines. Preferred acids are various sulfonic acids with functionality as para-toluene sulfonic acid (PTSA), dodecylbenzene sulfonic acid (DDBSA), and methane sulfonic acid (MSA). The epoxy begins to react upon contact, so the means of mixing, application, cure condition, and shelf-life, must be considered. Where acidic reactions are preferred for epoxies, photo acid generators (PAGs) offer rapid reactions and an acceptable shelf-life. These systems comprise sulfonium salts that release varying molecular weights of the sulfonic acid to trigger an immediate reaction. This rapid reaction is used in many photoresists. One common photoacid generator is triphenylsulfonium trifluoromethane sulfonate (TPST). A preferred commercial form of the PAG is Irgacure 290, tetralis(2,3,4,5,6-pentafluorophenyl)boranuide tris[4-(4-acetylphenyl)sulfanylphenyl]sulfonium (www.BASF.com). Typical amounts of a PAG is in the range of <2% by weight of epoxy resin system.

Initiators for acrylic monomers include thermal (thermal radical initiator, TRI) or photo activated free radical initiators. It is well known from the literature that these free-radical initiated systems will combine with the vinyl group of the acrylic, initiate a chain reaction, whereby the product acrylate free radical combines with other vinyl groups of adjacent acrylics and produce final crosslinked product. These TRI materials include inorganic persulfates such as ammonium persulfate (APS), potassium persulfate, and sodium persulfate, and organic persulfates such as quaternary ammonium persulfates (e.g. tridodecyl ammonium persulfate); peroxides include benzoyl peroxide (BPO), methyl ethyl ketone peroxide, dicumyl peroxide, and benzopinacole (BK), cumene dihydrogen peroxide, and those organic peroxides under the tradename Luperox™ (Arkema, Inc., www.arkema-inc.com), azo-compounds including 2,2'-azobisisobutyrnitrile (AIBN), 4,4-azobis(4-cyanovaleric acid), 1,1'-azobis(cyclohexanecarbonitrile), acetates as peracetic acid, and tert-butyl peracetate. Benzoin photoinitiators are common for use as initiators for acrylic chemistry. One type of benzoin photosensitizer is 2-phenylacetophenone, which undergoes photoscission to release radicals of benzoyl, and benzyl, which become the primary chain polymerization initiators in the curing process. Photochemically generated free radicals react directly with the double bond of the vinyl monomer as a chain-initiating step. The invention involves a cure process between a photoinitiator that is present in the liquid polymer system and actinic radiation from an ultraviolet emission source. Common photoinitiators include benzoin ethers, acetophenones, benzoyl oximes, and acylphosphines. These initiators may include phenylglyoxylate, benzyldimethylketal, ocaminoketone, ochydroxyketone, monoacyl phosphine (MAPO), bisacylphosphine (BAPO), metallocene, and iodonium salt. Preferred initiators include 2-hydroxy-2-methyl-1-phenyl-1-propanone (CAS #7473-98-5) and phosphine oxide phenylbis(2,4,6-trimethylbenzoyl)—(CAS #162881-26-7). A trade name product, which represents these materials, includes Irgacure 2022, as manufactured by *CIBA Specialty Chemicals*, Basel, Switzerland. The product exhibits absorption maxima at 365 nm, 285 nm, and 240 nm. Concentrations are used anywhere at ≤5% by weight.

Release layer mixtures comprising silicone resins may contain anywhere from 20-100% solids of silicone polymers having polysiloxane-vinyl and silyl-hydride character. In the presence of a metal catalyst, the vinyl compounds initiate free radicals that undergo addition polymerization with the silyl-hydride to produce a polymerized final product. To control the reaction rate for application and bonding, there are chelates binding the platinum. During heat exposure, the chelate degrades to release platinum and then triggers polymerization. In the case of silanol polysiloxanes, these monomers will crosslink upon heat exposure, usually in the range 200-250C.

Additives may also be present to facilitate adjusted adhesion. For example, the use of fluoropolymers are known for surface sensitive activity. The addition of fluoropolymer surfactants meet this objective. Other common surfactants as nonionics or charged species as cationic or anionic may provide surface sensitive adjustments in adhesion and also allowing fluctuations in melt point to give an amorphous character to improve adhesion.

Release layers may be formed from inorganic materials as various alkali element or related conjugated salt present in a carrier solvent (e.g. water, etc.). Such conjugated salt may exist in an ionic mixture where cations may include ammonium ($NH_4^+$), hydronium ($H_3O^+$) and metals as $M^{+n}$, where M includes Al, Sb, As, Ba, Be, Bi, Cd, Ca, Cr, Co, Cu, Fe, Pb, Li, Mg, Mn, Hg, Ni, K, Sc, Ag, Na, Sr, Sn, and Zn, and n varies from 1 to 5. Anions present in the inorganic mixture may be present as acetates, borates, bromates, carbonates, chlorates, chlorites, chromates, cyanamides, cyanide, dichromates, ferricyanide, ferrocyanide, phosphates, sulfates, nitrate, sulfite, oxide, oxalate, nitride, nitrite, hydroxide, hypochlorite, permanganate, silicate, stannate, stannite, tartrate, thiocyanate, and halogens as $Y^{-x}$, where Y is Br, Cl, F, H, I, O, N, P, and S, and x varies from 1-3. The cations and anions exist as conjugates of each other, as in the case of KCl (i.e. $K^+/Cl^-$).

The release layer may also contain fillers. These are specifically exemplified by fibrous fillers such as glass fiber, asbestos, alumina fiber, ceramic fiber composed of both alumina and silica, boron fiber, zirconia fiber, silicon carbide fiber, metal fibers, polyester fibers, aramid fiber, nylon fibers, phenolic fibers, and natural fibers originating from plants (e.g. cellulose); granular or particulate fillers such as fused silica, precipitated silica, fumed silica, calcined silica, zinc oxide, calcined clay, carbon black, glass beads, alumina, talc, calcium carbonate, clay, aluminum hydroxide, barium sulfate, titanium dioxide, aluminum nitride, silicon carbide, magnesium oxide, beryllium oxide, kaolin, mica, zirconia, and so forth; and mixtures of two or more of the preceding.

There exist several mechanisms for curing, B-staging, reacting, and alike for applying the release layer. There must be sufficient wetting for smooth application. Wetting is defined as the interaction of a lower contact angle (low energy) liquid or semi-solid onto a higher contact angle (higher energy) substrate. In many cases, the difference in surface energy between the adhesive and surface can be as low as 10 dynes/cm, however, the difference is preferably much larger. In optimum conditions, a lower energy release layer will wet and spread over the higher energy surface of the substrate and achieve good wetting.

Although wetting is fundamental to the coating process, the resulting interfacial wetting is dependent upon the chemistry of the coating and the interaction of its chemical functionality with the substrate or adhesive. This interaction is dependent upon the application, cure, and affixing steps. The chemistry of the release layer may comprise organic resins in pure form (i.e. 100% solids) or dissolved into carrier solvents. Cure programs may involve a soft bake step followed by a hard bake to drive-off undesirable components by outgassing. The mechanism by which the release layer is applied and cured includes a plurality of approaches which this invention is not limited. Choices on these approaches are based upon many considerations, including the process by which thin solid unit materials are subsequently applied to minimize the existence of trapped air and completely fill any voids. Regardless of the approach, the final objective is to achieve an applied release layer whereby manufacturing process is allowed to proceed and subsequently deposit a thin solid material that comprises the electronic device.

Once the manufacturing process is complete, removal of the release layer occurs. The exact removal mechanism may vary between conventional methods of peeling to a lift-off approach. Where necessary, the removal of the release layer proceeds by applying an external force in a specific direction normal or defined by some angle referenced to the direction of the carrier substrate. The amount of the applied external force is dependent upon the adhesion force of the release layer. Typically, the external force will be applied to a level that exceeds the adhesion force of the release layer such that it begins to lift-off from the carrier substrate. To reduce harm to the integrity of the thin solid material that is deposited onto the release layer, the external force must not exceed the tensile strength of the release layer and the configuration which it is removed. The exact mechanism that is chosen for the removal of the release layer will depend upon several factors to include the interfacial adhesion, tensile force, and the ability to bend the release layer during removal. For example, some release layers may exhibit a robust nature which may be peeled in a 90 degree or 180 degree orientation. In the case where the thin solid metal deposited onto the release layer is present as a foil or film, there may exhibit certain brittle character. The sensitive and brittle character of the thin solid material may determine the removal conditions.

Applications of thin solid materials onto a release layer that is affixed to the carrier are becoming a common challenge in the manufacturing of electronic devices. Options are needed to design simple release layers used to manufacture electronics. For example, semiconductor wafer substrates are round, extend to 12" in diameter, and are robot transferred from tool to cassette. Conversely, display panels are square or rectangular, can extend to more than 60" on a side, and are conveyorized. In consideration of thin solid materials which are deposited for the device structure as needed for each market, substrate thickness may vary from 10-100 um (microns). More flexible options to apply and use release layers to make devices will provide a broad range of options in manufacturing. These options reduce the need of new tooling and additional manufacturing steps. Through these practices and others not mentioned here, the invention's novelty and uniqueness is realized.

EXAMPLES

The compositions of the invention and the method of making of the examples are described. It is understood, however, that the invention is not meant to be limited to the details described therein. In the examples, the percentages provided are percent (%) by weight unless otherwise stated. The invention is further illustrated, without limitation, by the following examples. The measurement of performance and selectivity of the invention is conducted using practices readily accepted by the industry.

Coatings are produced on a Brewer Science, Inc. CB-100 spin-coater, while spray and encapsulation uses custom tooling designed at Daetec. Metrology data is generated by a XP-1 stylus profiler, AFP-200 atomic force profiler, and a Xi-100 optical profiler (www.kla-tencor.com), using equipment settings 5 mg stylus load, minimum 4 mm distance, and a speed of 0.5 mm/sec. Modified thermogravimetric test methodology for outgas is conducted by typical laboratory scales (+/−0.1 mg). Furnace support uses box type #ST-1200C-121216 with microprocessor programming, nitrogen purge, and dispersion fan for chamber uniformity (www.sentrotech.com). Force gage M5-series with 90 degree configuration as tape peel with moving sled and stand ESM301, fixtures, and software (www.mark-10.com).

Silicon wafers and glass plates (~0.5 mm thick) are used as the inorganic substrate (carrier substrate) procured as display quality substrates (www.fitekcorp.com.tw). Onto these substrates, the material representing the release layer is applied, cured, and processed in a manner consistent with affixing of the solid work unit material (material make-up of the electronic device).

The materials listed here form the basis for the survey, which the invention is demonstrated. Multiple materials are tested and described for each example. Where organic polymers are used, these resins are commonly dissolved into n,n-dimethylacetamide (DMAC), may exist as their monomer within n-methylpyrrolidone (NMP), or may exist as their monomer in a 100% solids system (no casting solvent) as a silicone. Polyimide samples include UBE u-varnish (UBE Industries, LTD, www.ube.com.jp) and U-imide series (Unitika Trading Company, LTD, www.unitika.co.jp). Silicone monomers exist as Silres series of flake resins 603, 805 (Wacker Chemical Corporation, www.wacker.com).

Inorganic candidate release layers are prepared from various aqueous solutions containing nanoparticle fillers and having specific binder/filler ratios. Binder systems include lithium and potassium silicate (PQ Corporation, www.pqcorp.com). Fillers are present as fumed silica as Aerosil 200 nanoparticle and dispersions thereof, including Aerodisp W-series silica with various chemical pH additives (Evonik Deguss GmbH, www.aerosil.com). Polymer fixing agent is polyvinylpyrollidone (PVP), an aqueous dissolvable polymer used to maintain dispersion during cure (International Scientific Products Corporation, www.ispcorp.com).

The following experiments demonstrate the thermal and mechanical properties of materials used as release coatings to form the substrate upon which fabrication of the microelectronic device proceeds.

Example #1

The organic materials are chosen for their thermal resistance and tested by measuring outgassing as % weight loss when subjected to certain temperatures, commonly referred to a thermogravimetric analysis (TGA). Polymers are prepared in respective casting solvents and cured to 350C in oxygen atmosphere before testing. Results for TGA are shown in Table 1. Results suggest polyimide and POSS nanoparticle addition result in lowest outgas values over the thermal exposure.

TABLE 1

TGA results of organic polymers for release layers. Outgas measurement as % wt loss for each exposure temperature (30 min). Preferred outgas levels are low and non-substantial.

| Release Layer | 350 C. | 400 C. | 450 C. | 500 C. |
|---|---|---|---|---|
| PI - UBE U-Varnish | -0- | 8.56 | 9.81 | 10.80 |
| PI - U Imide AR | -0- | 7.89 | 8.36 | 9.46 |
| PI - U Imide C + POSS | -0- | 1.07 | 1.59 | 2.14 |
| Veradel A301 (polyethersulfone) | -0- | 2.07 | 3.80 | 14.36 |
| Silicone 805:603 blend | -0- | 9.70 | 25.08 | 35.55 |

Example #2

Release layer candidates are applied to glass plates and cured to 350C. In the case of polyimide and silicone release layers, an interfacial silicone coating is applied to effect adhesive interaction with the substrate. Coating samples are subjected to thin film vacuum deposition of silicon dioxide at 400C. The single layer of thin film deposit is applied and subsequent temperature exposure is held at 400C for 30 min. Adhesion testing is performed before and after the deposition utilizing standard tape peel measurement with a force gage and using sample preparations with tape adhesion to the release layer. The adhesion test results are shown in Table 2.

TABLE 2

Adhesion test performed as 90 degree manual pull, force as grams/cm. All materials which exhibited removal and quantified as adhesion force data are intact and free of residue, no cleaning is necessary.

| Release Layer | Interfacial adhesive | Before Deposition Peel Force (gF/cm) | After Deposition Peel Force (gF/cm) |
|---|---|---|---|
| PI - UBE U-Varnish | Yes | 19.4 | 38.9 |
| PI - U Imide AR | Yes | 73.1 | 207.6 |
| PI - U Imide C + POSS | Yes | 64.9 | 105 |
| Silicone 805:603 blend | None | No Removal* | No Removal* |
| Veradel A301 (polyethersulfone) | None | 5.7 | 15.1 |

*No removal: release layer exhibited damage upon removal. Material is not intact.

Example #3

Inorganic candidates for release layers are studied for their thermal resistance by thermogravametric analysis (TGA) using % wt loss by outgas. The baseline used is Veradel A301, polyethersulfone blend from examples #1 and #2. Inorganic polymers are blended with inorganic nanoparticles at various loading and cured to 350C to remove excessive water in the system. Inorganic systems are represented in normalized wt % content as follows: filler:PVP:silicate ratio, silicate described as lithium or potassium based product. For example, 60:30:10 Li is 60%/30%/10% as fumed silica/PVP/lithium silicate. The results are provided in Table 3.

TABLE 3

TGA results of release layer candidates. Outgas measurement as % wt loss for each exposure temperature (30 min). Preferred outgas levels are low and non-substantial.

| Release Layer | 200 C. | 250 C. | 350 C. | 450 C. | 500 C. | 550 C. | 600 C. |
|---|---|---|---|---|---|---|---|
| 60:30:10 Li | 0 | 0 | 0 | 0 | 0.21 | 0.2 | 0.52 |
| 60:30:10 K | 0 | 0 | 0 | 0 | 0 | 0 | 0 |
| 25:1:74 Li | 0 | 0 | 0 | 0.32 | 0.44 | 0.49 | 0.59 |
| 25:1:74 K | 0 | 0 | 0 | 0.33 | 0.53 | 0.41 | 0.58 |
| Veradel A301 | 0 | 0 | 0 | 2.08 | 10.68 | 40.28 | 58.46 |

Example #4

Release layer coatings are prepared and applied to glass plates, coated and cured on to 350C. Cured release layers are subjected to thin film vacuum deposition of silicon dioxide at 400C. The single layer of thin film deposit is applied and subsequent temperature exposure is held at 400C for 30 min. An adhesion test is performed before and after the deposition. Inorganic systems are represented in normalized wt % content as follows: filler:PVP:silicate ratio, silicate described as lithium or potassium based product. For example, 60:30:10 Li is 60%/30%/10% would be fumed silica/PVP/lithium silicate. The adhesion test results on release layers with silicon dioxide deposition are shown in Table 4.

TABLE 4

Peel test as 90 degree manual pull, results as pass/fail. All materials which exhibited removal as a "pass" by overcoming the respective adhesion force are intact and free of residue, no cleaning is necessary.

| Release Layer | Adhesive | Peel Force (gF/cm) Before Deposition | Peel Force (gF/cm) After Deposition |
|---|---|---|---|
| 60:30:10 Li | Inorganic Blend | Removal | No Removal* |
| 60:30:10 K | Inorganic Blend | Removal | Removal |
| 25:1:74 Li | Inorganic Blend | Removal | Removal |
| 25:1:74 K | Inorganic Blend | Removal | No Removal* |
| Veradel A301 | No Adhesive | Removal | No Removal* |

*No removal: release layer exhibited damage upon removal. Material is not intact.

What is claimed is:

1. A release layer comprising a binder material that is affixed to a rigid carrier substrate, and subsequently, with the aid of an external force, is removed from the rigid substrate without harm to the release layer and without the need for a subsequent cleaning process, wherein the release layer serves as a permanent substrate onto which is fabricated a flexible work product, wherein both release layer and work product are removed as one unit from the rigid carrier substrate, and wherein the binder is affixed directly to the carrier substrate without the aid of external adhesive and comprises organic and inorganic chemical families.

2. The release layer of claim 1, wherein the binder is affixed to the carrier substrate and comprises organic and inorganic chemical families which do not substantially outgas after curing.

3. The release layer of claim 1, wherein the binder comprises one or more chemical resins.

4. The release layer of claim 3, wherein the chemical resins of the binder comprise one or more from the group of epoxy, acrylate, silicone, urethane, rubber, and engineering polymers.

5. The release layer of claim 4, wherein the engineering polymers comprise one or more from the group of polyimide, polyamide, polyamideimide, polybenzimidazole, polybenzoxazole, polysulfone, polyethersulfone, polyphenylsulfone, polyarylether, polyetheretherketone, polyvinyidenedifluoride, cyclic olefin copolymer, polyethylene terephthalate, polybutylene terephthalate, polyacrylonitrile, polyaryletherketone, polyketoneketone, styrene-acrylonitrile, polycarbonate, polystyrene, polyvinylchloride, polyphenylene sulfide, polytrimethylene terephthalate, polyvinylidene chloride, acrylonitrile butadiene styrene, and liquid crystal polymer.

6. The release layer of claim 4, wherein the binder further comprises one or more polymer reaction initiators.

7. The release layer of claim 6, wherein the initiators comprise one or more from the group of organic acid, photoacid generator, photo base generator, organic amine, thermal free radical, and photo free radical initiators.

8. The release layer of claim 1, wherein the binder comprises one or more conjugated salts.

9. The release layer of claim 8, wherein the one or more conjugated salts comprise anions and cations.

10. The release layer of claim 9, wherein the anions comprise one or more of acetate, borate, bromate, carbonate, chlorate, chlorite, chromate, cyanamide, cyanide, dichromates, ferricyanide, ferrocyanide, phosphate, sulfate, nitrate, sulfite, oxide, oxalate, nitride, nitrite, hydroxide, hypochlorite, permanganate, silicate, stannate, stannite, tartrate, thiocyanate, and additionally halogen, hydrogen, oxygen, nitrogen, phosphorous and sulfur is represented as $Y^{-x}$, where Y is Br, Cl, F, H, I, O, N, P, and S, and x varies from 1-3.

11. The release layer of claim 9, wherein the cations comprise one or more of ammonium (NH4+), hydronium (H3O+), and metal represented as $M^{+n}$, where M includes Al, Sb, As, Ba, Be, Bi, Cd, Ca, Cr, Co, Cu, Fe, Pb, Li, Mg, Mn, Hg, Ni, K, Sc, Ag, Na, Sr, Sn, and Zn, and n varies from 1 to 5.

12. The release layer of claim 1, wherein the binder further comprises a filler.

13. The release layer of claim 12, wherein the filler comprises one or more from the group of nanoparticle, nanofiber, nanometal, fiber, glass bead, glass sphere, ceramic, and cellulose.

14. The release layer of claim 1 wherein the binder comprises one or more from the group of metal, ceramic, glass, and organic polymer.

15. The release layer of claim 1 wherein the binder is produced from evaporation and comprises one or more from the group of metal, ceramic, glass, and organic polymer.

16. The release layer of claim 1 wherein the binder is produced from plasma deposition and comprises one or more from the group of metal, ceramic, glass, and organic polymer.

17. The release layer of claim 1 wherein the binder is produced from electrolytic deposition and comprises one or more from the group metal, ceramic, glass, and organic polymer.

18. A manufacturing process using the release layer of claim 1, where the process is used in an electronics process.

19. The manufacturing process of claim 18 where the electronics process is used in a semiconductor process.

20. The manufacturing process of claim 19 where the electronics process is used in a display process.

21. The release layer of claim 1, where the release layer is exposed to elevated temperatures of 350° C. and outgassing is less than 0.5%.

* * * * *